(12) United States Patent
Ohto et al.

(10) Patent No.: US 9,334,161 B2
(45) Date of Patent: May 10, 2016

(54) PROCESSING LIQUID FOR SUPPRESSING PATTERN COLLAPSE OF FINE METAL STRUCTURE AND METHOD FOR PRODUCING FINE METAL STRUCTURE USING SAME

(75) Inventors: Masaru Ohto, Tokyo (JP); Hiroshi Matsunaga, Tokyo (JP); Kenji Yamada, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 13 days.

(21) Appl. No.: 13/499,462

(22) PCT Filed: Sep. 29, 2010

(86) PCT No.: PCT/JP2010/066877
§ 371 (c)(1),
(2), (4) Date: Mar. 30, 2012

(87) PCT Pub. No.: WO2011/040423
PCT Pub. Date: Apr. 7, 2011

(65) Prior Publication Data
US 2012/0181249 A1 Jul. 19, 2012

(30) Foreign Application Priority Data
Oct. 2, 2009 (JP) ................................. 2009-230478

(51) Int. Cl.
*H01B 13/00* (2006.01)
*B44C 1/22* (2006.01)
(Continued)

(52) U.S. Cl.
CPC ............... *B81C 1/0092* (2013.01); *C09K 13/00* (2013.01); *C23G 1/26* (2013.01); *H01L 21/02057* (2013.01)

(58) Field of Classification Search
CPC ........ B81C 1/0092; C09K 13/00; C23G 1/26; H01L 21/02057
USPC .................................................. 252/79.1–79.5
See application file for complete search history.

(56) References Cited

U.S. PATENT DOCUMENTS 6,086,779 A * 7/2000 Bishop et al. ................... 216/93
6,247,856 B1 * 6/2001 Shibano et al. ............... 396/565
(Continued)

FOREIGN PATENT DOCUMENTS

| CN | 1290402 A | 4/2001 |
|---|---|---|
| CN | 100526998 C | 8/2009 |

(Continued)

OTHER PUBLICATIONS

U.S. Appl. No. 13/820,835, filed Mar. 5, 2013, Matsunaga, et al.

*Primary Examiner* — Nadine Norton
*Assistant Examiner* — Christopher Remavege
(74) *Attorney, Agent, or Firm* — Oblon, McClelland, Maier & Neustadt, L.L.P.

(57) ABSTRACT

There are provided a processing liquid for suppressing pattern collapse of a fine metal structure, containing at least one member selected from an imidazolium halide having an alkyl group containing 12, 14 or 16 carbon atoms, a pyridinium halide having an alkyl group containing 14 or 16 carbon atoms, an ammonium halide having an alkyl group containing 14, 16 or 18 carbon atoms, a betaine compound having an alkyl group containing 12, 14 or 16 carbon atoms, and an amine oxide compound having an alkyl group containing 14, 16 or 18 carbon atoms, and a method for producing a fine metal structure using the same.

14 Claims, 1 Drawing Sheet

(51) Int. Cl.
  *B81C 1/00* (2006.01)
  *C09K 13/00* (2006.01)
  *C23G 1/26* (2006.01)
  *H01L 21/02* (2006.01)

(56) References Cited

U.S. PATENT DOCUMENTS

| | | | |
|---|---|---|---|
| 6,265,309 B1 | 7/2001 | Gotoh et al. | |
| 6,281,176 B1* | 8/2001 | Cochran et al. | 510/123 |
| 6,465,403 B1* | 10/2002 | Skee | 510/175 |
| 6,534,459 B1 | 3/2003 | Yata et al. | |
| 6,670,107 B2* | 12/2003 | Lachowski | 430/331 |
| 7,485,612 B2* | 2/2009 | Takashima | 510/175 |
| 7,888,300 B2* | 2/2011 | Seki et al. | 510/109 |
| 7,923,424 B2* | 4/2011 | Small | 510/175 |
| 7,928,046 B2* | 4/2011 | Ilardi et al. | 510/175 |
| 8,367,312 B2* | 2/2013 | Sawada et al. | 430/325 |
| 2002/0115022 A1* | 8/2002 | Messick et al. | 430/311 |
| 2004/0029395 A1 | 2/2004 | Zhang et al. | |
| 2004/0029396 A1* | 2/2004 | Zhang et al. | 438/748 |
| 2004/0038532 A1 | 2/2004 | Kawakami et al. | |
| 2005/0158672 A1 | 7/2005 | Endo et al. | |
| 2006/0124586 A1 | 6/2006 | Kobayashi et al. | |
| 2006/0223318 A1 | 10/2006 | Tagawa | |
| 2008/0194452 A1* | 8/2008 | Tsai et al. | 510/433 |
| 2009/0004608 A1* | 1/2009 | Sawada et al. | 430/325 |
| 2009/0084754 A1 | 4/2009 | Hayamizu et al. | |
| 2013/0280123 A1* | 10/2013 | Chen | H01L 21/302 422/1 |

FOREIGN PATENT DOCUMENTS

| | | |
|---|---|---|
| EP | 0 812 012 A1 | 12/1997 |
| JP | 9-3678 A | 1/1997 |
| JP | 11 087306 | 3/1999 |
| JP | 2003-109949 A | 4/2003 |
| JP | 2005-174961 A | 6/2005 |
| JP | 2005 181814 | 7/2005 |
| JP | 2005 292827 | 10/2005 |
| JP | 2006-163314 A | 6/2006 |
| JP | 2006 310755 | 11/2006 |

* cited by examiner

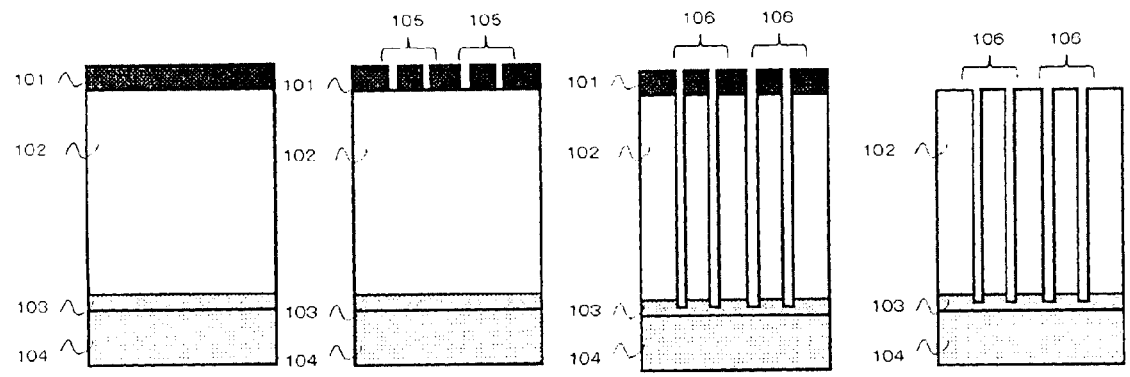
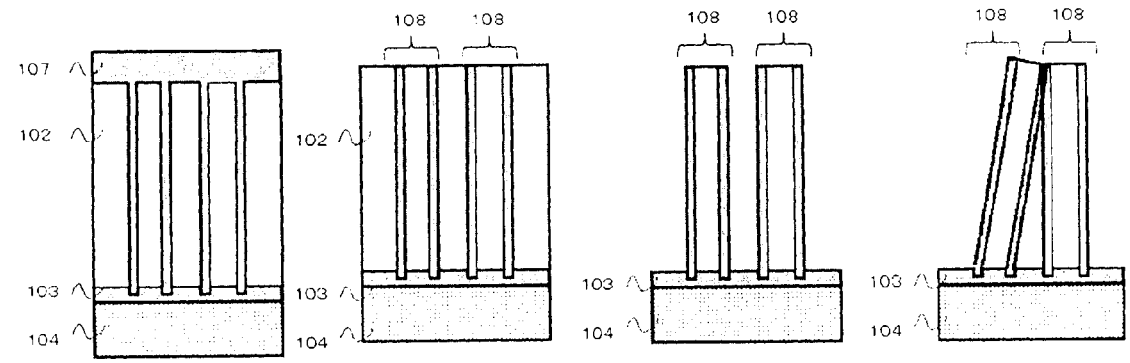
Fig.1-(a)   Fig.1-(b)   Fig.1-(c)   Fig.1-(d)
Fig.1-(e)   Fig.1-(f)   Fig.1-(g)   Fig.1-(h)

US 9,334,161 B2

PROCESSING LIQUID FOR SUPPRESSING PATTERN COLLAPSE OF FINE METAL STRUCTURE AND METHOD FOR PRODUCING FINE METAL STRUCTURE USING SAME

TECHNICAL FIELD

The present invention relates to a processing liquid for suppressing pattern collapse of a fine metal structure, and a method for producing a fine metal structure using the same.

This application is a 371 of PCT/JP2010/066877 filed Sep. 29, 2010. Priority to Japanese patent application 2009-230478, filed Oct. 2, 2009, is claimed.

BACKGROUND ART

The photolithography technique has been employed as a formation and processing method of a device having a fine structure used in a wide range of fields of art including a semiconductor device, a circuit board and the like. In these fields of art, reduction of size, increase of integration degree and increase of speed of a semiconductor device considerably proceed associated with the highly sophisticated demands on capabilities, which bring about continuous miniaturization and increase of aspect ratio of the resist pattern used for photolithography. However, the progress of miniaturization of the resist pattern causes pattern collapse as a major problem.

It has been known that upon drying a resist pattern from a processing liquid used in wet processing (which is mainly a rinsing treatment for washing away the developer solution) after developing the resist pattern, the collapse of the resist pattern is caused by the stress derived by the surface tension of the processing liquid. For preventing the collapse of the resist pattern, such methods have been proposed as a method of replacing the rinsing liquid by a liquid having a low surface tension using a nonionic surfactant, a compound soluble in an alcohol solvent, or the like (see, for example, Patent Documents 1 and 2), and a method of hydrophobizing the surface of the resist pattern (see, for example, Patent Document 3).

In a fine structure formed of a metal, a metal nitride, a metal oxide or the like (which may be hereinafter referred to as a "fine metal structure", and a metal, a metal nitride, a metal oxide or the like may be hereinafter referred totally as a "metal") by the photolithography technique, the strength of the metal itself constituting the structure is larger than the strength of the resist pattern itself or the bonding strength between the resist pattern and the substrate, and therefore, the collapse of the structure pattern is hard to occur as compared to the resist pattern. However, associated with the progress of reduction of size, increase of integration degree and increase of speed of a semiconductor device and a micromachine, the pattern collapse of the structure is becoming a major problem due to miniaturization and increase of aspect ratio of the resist pattern. The fine metal structure has a surface state that is totally different from that of the resist pattern, which is an organic material, and therefore, there is no effective measure for preventing the pattern collapse of the structure. Accordingly, the current situation is that the degree of freedom on designing the pattern for producing a semiconductor device or a micromachine with reduced size, increased integration degree and increased speed is considerably impaired since the pattern is necessarily designed for preventing the pattern collapse.

RELATED ART DOCUMENTS

Patent Documents

Patent Document 1: JP-A-2004-184648
Patent Document 2: JP-A-2005-309260
Patent Document 3: JP-A-2006-163314

SUMMARY OF THE INVENTION

Problems to be Solved by the Invention

As described above, the current situation is that no effective technique for suppressing pattern collapse has been known in the field of a fine metal structure, such as a semiconductor device and a micromachine.

The present invention has been developed under the circumstances, and an object thereof is to provide a processing liquid that is capable of suppressing pattern collapse of a fine metal structure, such as a semiconductor device and a micromachine, and a method for producing a fine metal structure using the same.

Means for Solving the Problems

As a result of earnest investigations made by the inventors for achieving the object, it has been found that the object can be achieved with a processing liquid containing at least one member selected from an imidazolium halide having an alkyl group containing 12, 14 or 16 carbon atoms, a pyridinium halide having an alkyl group containing 14 or 16 carbon atoms, an ammonium halide having an alkyl group containing 14, 16 or 18 carbon atoms, a betaine compound having an alkyl group containing 12, 14 or 16 carbon atoms, and an amine oxide compound having an alkyl group containing 14, 16 or 18 carbon atoms.

The present invention has been completed based on the finding. Accordingly, the gist of the present invention is as follows.

(1) A processing liquid for suppressing pattern collapse of a fine metal structure, containing at least one member selected from an imidazolium halide having an alkyl group containing 12, 14 or 16 carbon atoms, a pyridinium halide having an alkyl group containing 14 or 16 carbon atoms, an ammonium halide having an alkyl group containing 14, 16 or 18 carbon atoms, a betaine compound having an alkyl group containing 12, 14 or 16 carbon atoms, and an amine oxide compound having an alkyl group containing 14, 16 or 18 carbon atoms.

(2) The processing liquid for suppressing pattern collapse of a fine metal structure according to the item (1), wherein the alkyl group having 12 carbon atoms is a dodecyl group, the alkyl group having 14 carbon atoms is a tetradecyl group, the alkyl group having 16 carbon atoms is hexadecyl group, and the alkyl group having 18 carbon atoms is an octadecyl group.

(3) The processing liquid for suppressing pattern collapse of a fine metal structure according to the item (1) or (2), which further contains water.

(4) The processing liquid for suppressing pattern collapse of a fine metal structure according to any one of the items (1) to (3), wherein a content of a compound selected from an imidazolium halide having an alkyl group containing 12, 14 or 16 carbon atoms, a pyridinium halide having an alkyl group containing 14 or 16 carbon atoms, an ammonium halide having an alkyl group containing 14, 16 or 18 carbon atoms, a betaine compound having an alkyl group containing 12, 14 or 16 carbon atoms, and an amine oxide compound having an alkyl group containing 14, 16 or 18 carbon atoms is from 10 ppm to 10%.

(5) The processing liquid for suppressing pattern collapse of a fine metal structure according to any one of the items (1) to (4), wherein the pattern of the fine metal structure contains tungsten.

(6) A method for producing a fine metal structure, containing after wet etching or dry etching, a rinsing step using the processing liquid according to any one of the items (1) to (5).

(7) The method for producing a fine metal structure according to the item (6), wherein the pattern of the fine metal structure contains tungsten.

(8) The method for producing a fine metal structure according to the item (6) or (7), wherein the fine metal structure is a semiconductor device or a micromachine.

In the specification, the cases where the number of carbon atoms of the alkyl group is 12, 14, 16 and 18 may be referred to as C12, C14, C16 and C18, respectively, in some cases.

Effect of the Invention

According to the present invention, there are provided a processing liquid that is capable of suppressing pattern collapse of a fine metal structure, such as a semiconductor device and a micromachine, and a method for producing a fine metal structure using the same.

BRIEF DESCRIPTION OF THE DRAWINGS

FIG. 1 The FIGURE includes schematic cross sectional views of each production steps of fine metal structures produced in Examples 1 to 18 and Comparative Examples 1 to 14.

EMBODIMENTS FOR CARRYING OUT THE INVENTION

The processing liquid of the present invention is used for suppressing pattern collapse of a fine metal structure, and contains at least one member selected from an imidazolium halide having a C12, C14 or C16 alkyl group, a pyridinium halide having a C14 or C16 alkyl group, an ammonium halide having a C14, C16 or C18 alkyl group, a betaine compound having a C12, C14 or C16 alkyl group, and an amine oxide compound having a C14, C16 or C18 alkyl group.

It is considered that the imidazolium halide having a C12, C14 or C16 alkyl group, the pyridinium halide having a C14 or C16 alkyl group, the ammonium halide having a C14, C16 or C18 alkyl group, the betaine compound having a C12, C14 or C16 alkyl group, and the amine oxide compound having a C14, C16 or C18 alkyl group used in the processing liquid of the present invention are adsorbed on the metal material used in the pattern of the fine metal structure, thereby hydrophobizing the surface of the pattern. The hydrophobization in this case means that the contact angle of the metal surface having been processed with the processing liquid of the present invention with respect to water is 70° or more.

Examples of the imidazolium halide having a C12, C14 or C16 alkyl group include 1-dodecyl-3-methylimidazolium chloride, 1-dodecyl-3-methylimidazolium bromide, 1-dodecyl-3-methylimidazolium iodide, 1-methyl-3-dodecylimidazolium chloride, 1-methyl-3-dodecylimidazolium bromide, 1-methyl-3-dodecylimidazolium iodide, 1-dodecyl-2-methyl-3-benzylimidazolium chloride, 1-dodecyl-2-methyl-3-benzylimidazolium bromide, 1-dodecyl-2-methyl-3-benzylimidazolium iodide, 1-tetradecyl-3-methylimidazolium chloride, 1-tetradecyl-3-methylimidazolium bromide, 1-tetradecyl-3-methylimidazolium iodide, 1-methyl-3-tetradecylimidazolium chloride, 1-methyl-3-tetradecylimidazolium bromide, 1-methyl-3-tetradecylimidazolium iodide, 1-hexadecyl-3-methylimidazolium chloride, 1-hexadecyl-3-methylimidazolium bromide, 1-hexadecyl-3-methylimidazolium iodide, 1-hexadecyl-4-methylimidazolium chloride, 1-hexadecyl-4-methylimidazolium bromide, 1-hexadecyl-4-methylimidazolium iodide, 1-methyl-3-hexadecylimidazolium chloride, 1-methyl-3-hexadecylimidazolium bromide and 1-methyl-3-hexadecylimidazolium iodide, and in particular, 1-dodecyl-3-methylimidazolium chloride, 1-tetradecyl-3-methylimidazolium chloride and 1-hexadecyl-3-methylimidazolium chloride are preferred.

Examples of the pyridinium halide having a C14 or C16 alkyl group include tetradecylpyridinium chloride, tetradecylpyridinium bromide, tetradecylpyridinium iodide, hexadecylpyridinium chloride, hexadecylpyridinium bromide, hexadecylpyridinium iodide, 1-tetradecyl-4-methylpyridinium chloride, 1-tetradecyl-4-methylpyridinium bromide, 1-tetradecyl-4-methylpyridinium iodide, 1-hexadecyl-4-methylpyridinium chloride, 1-hexadecyl-4-methylpyridinium bromide and 1-hexadecyl-4-methylpyridinium iodide, and in particular, tetradecylpyridinium chloride, hexadecylpyridinium chloride, 1-tetradecyl-4-methylpyridinium chloride and 1-hexadecyl-4-methylpyridinium chloride are preferred.

Examples of the ammonium halide having a C14, C16 or C18 alkyl group include tetradecyltrimethylammonium chloride, tetradecyltrimethylammonium bromide, tetradecyltrimethylammonium iodide, hexadecyltrimethylammonium chloride, hexadecyltrimethylammonium bromide, hexadecyltrimethylammonium iodide, octadecyltrimethylammonium chloride, octadecyltrimethylammonium bromide, octadecyltrimethylammonium iodide, dimethylethyltetradecylammonium chloride, dimethylethyltetradecylammonium bromide, dimethylethyltetradecylammonium iodide, dimethylethylhexadecylammonium chloride, dimethylethylhexadecylammonium bromide, dimethylethylhexadecylammonium iodide, dimethylethyloctadecylammonium chloride, dimethylethyloctadecylammonium bromide, dimethylethyloctadecylammonium iodide, benzyldimethyltetradecylammonium chloride, benzyldimethyltetradecylammonium bromide, benzyldimethyltetradecylammonium iodide, benzyldimethylhexadecylammonium chloride, benzyldimethylhexadecylammonium bromide, benzyldimethylhexadecylammonium iodide, benzyldimethyloctadecylammonium chloride, benzyldimethyloctadecylammonium bromide and benzyldimethyloctadecylammonium iodide, and in particular, tetradecyltrimethylammonium chloride, hexadecyltrimethylammonium chloride, octadecyltrimethylammonium chloride, benzyldimethyltetradecylammonium chloride, benzyldimethylhexadecylammonium chloride and benzyldimethyloctadecylammonium chloride are preferred.

The alkyl group having 12 carbon atoms is preferably a dodecyl group, the alkyl group having 14 carbon atoms is preferably a tetradecyl group, the alkyl group having 16 carbon atoms is preferably hexadecyl group, and the alkyl group having 18 carbon atoms is preferably an octadecyl group. The compound that has the linear alkyl group may be adsorbed on a metal material highly densely.

More specifically, examples of the betaine compound having a C12, C14 or C16 alkyl group include dodecyldimethylaminoacetic acid betaine, tetradecyldimethylaminoacetic acid betaine, hexadecyldimethylaminoacetic acid betaine and palm oil fatty acid amide propylbetaine, and dodecyldimethylaminoacetic acid betaine and palm oil fatty acid amide propylbetaine are particularly preferred.

Preferred examples of the amine oxide compound having a C14, C16 or C18 alkyl group include dimethyltetradecylamine oxide, dimethylhexadecylamine oxide and dimethyloctadecylamine oxide.

The imidazolium halide having a C12, C14 or C16 alkyl group is preferably an imidazolium halide having a C14 or C16 alkyl group, and more preferably an imidazolium halide having a C16 alkyl group.

The pyridinium halide having a C14 or C16 alkyl group is preferably a pyridinium halide having a C16 alkyl group.

The ammonium halide having a C14, C16 or C18 alkyl group is preferably an ammonium halide having a C16 or C18 alkyl group, and more preferably an ammonium halide having a C18 alkyl group.

The amine oxide compound having a C14, C16 or C18 alkyl group is preferably an amine oxide compound having a C16 or C18 alkyl group, and more preferably an amine oxide compound having a C18 alkyl group.

The processing liquid of the present invention preferably further contains water and is preferably an aqueous solution. Preferred examples of the water include water, from which metallic ions, organic impurities, particles and the like are removed by distillation, ion exchange, filtering, adsorption treatment or the like, and particularly preferred examples thereof include pure water and ultrapure water.

The processing liquid of the present invention contains at least one member selected from the imidazolium halide having a C12, C14 or C16 alkyl group, the pyridinium halide having a C14 or C16 alkyl group, the ammonium halide having a C14, C16 or C18 alkyl group, the betaine compound having a C12, C14 or C16 alkyl group, and the amine oxide compound having a C14, C16 or C18 alkyl group described above, preferably contains water, and may contain various kinds of additives that are ordinarily used in processing liquids in such a range that does not impair the advantages of the processing liquid.

The content of the compound selected from the imidazolium halide having a C12, C14 or C16 alkyl group, the pyridinium halide having a C14 or C16 alkyl group, the ammonium halide having a C14, C16 or C18 alkyl group, the betaine compound having a C12, C14 or C16 alkyl group, and the amine oxide compound having a C14, C16 or C18 alkyl group (which is the total content in the case where plural compounds are contained) in the processing liquid of the present invention is preferably from 10 ppm to 10%.

When the content of the compound is in the range, the advantages of the compound may be sufficiently obtained. In consideration of handleability, economy and foaming, the compound is used preferably at a lower concentration of 5% or less, more preferably from 10 to 2,000 ppm, and further preferably from 10 to 1,000 ppm. In the case where the compound does not have sufficient solubility in water to cause phase separation, an organic solvent, such as an alcohol, may be added, and an acid or an alkali may be added to enhance the solubility. Even in the case where the processing liquid is simply turbid white without phase separation, the processing liquid may be used in such a range that does not impair the advantages of the processing liquid, and may be used while stirring to make the processing liquid homogeneous. Furthermore, for avoiding the white turbidity of the processing liquid, the processing liquid may be used after adding an organic solvent, such as an alcohol, an acid or an alkali thereto as similar to the above case.

The processing liquid of the present invention may be used favorably for suppressing pattern collapse of a fine metal structure, such as a semiconductor device and a micromachine. Preferred examples of the pattern of the fine metal structure include ones containing W (tungsten).

The fine metal structure may be patterned on an insulating film species, such as $SiO_2$ (a silicon oxide film) and TEOS (a tetraethoxy ortho silane), in some cases, or the insulating film species is contained as a part of the fine metal structure in some cases.

The processing liquid of the present invention can exhibit excellent pattern collapse suppressing effect to not only an ordinary fine metal structure, but also a fine metal structure with further miniaturization and higher aspect ratio. The aspect ratio referred herein is a value calculated from (height of pattern/width of pattern), and the processing liquid of the present invention may exhibit excellent pattern collapse suppressing effect to a pattern that has a high aspect ratio of 3 or more, and further 7 or more. The processing liquid of the present invention has excellent pattern collapse suppressing effect to a finer pattern with a pattern size (pattern width) of 300 nm or less, further 150 nm or less, and still further 100 nm or less, and with a pattern size of 50 nm or less and a line/space ratio of 1/1, and similarly to a finer pattern with a pattern distance of 300 nm or less, further 150 nm or less, still further 100 nm or less, and still further 50 nm or less and a cylindrical hollow or cylindrical solid structure.

Method for Producing Fine Metal Structure

The method for producing a fine metal structure of the present invention contains, after wet etching or dry etching, a rinsing step using the processing liquid of the present invention. More specifically, in the rinsing step, it is preferred that the pattern of the fine metal structure is made in contact with the processing liquid of the present invention by dipping, spray ejecting, spraying or the like, then the processing liquid is replaced by water, and the fine metal structure is dried. In the case where the pattern of the fine metal structure and the processing liquid of the present invention are in contact with each other by dipping, the dipping time is preferably from 10 seconds to 30 minutes, more preferably from 15 seconds to 20 minutes, further preferably from 20 seconds to 15 minutes, and particularly preferably from 30 seconds to 10 minutes, and the temperature condition is preferably from 10 to 60° C., more preferably from 15 to 50° C., further preferably from 20 to 40° C., and particularly preferably from 25 to 40° C. The pattern of the fine metal structure may be rinsed with water before making in contact with the processing liquid of the present invention. The contact between the pattern of the fine metal structure and the processing liquid of the present invention enables suppression of collapse of the pattern, in which a pattern is in contact with the adjacent pattern, through hydrophobization of the surface of the pattern.

The processing liquid of the present invention may be applied widely to a production process of a fine metal structure irrespective of the kind of the fine metal structure, as far as the production process has a step of wet etching or dry etching, then a step of wet processing (such as etching, cleaning or rinsing for washing the cleaning liquid), and then a drying step. For example, the processing liquid of the present invention may be favorably used after the etching step in the production process of a semiconductor device or a micromachine, for example, (i) after wet etching of an insulating film around an electroconductive film in the production of a DRAM type semiconductor device (see, for example, JP-A-2000-196038 and JP-A-2004-288710), (ii) after a rinsing step for removing contamination formed after dry etching or wet etching upon processing a gate electrode in the production of a semiconductor device having a transistor with a fin in the form of strips (see, for example, JP-A-2007-335892), and (iii)

after a rinsing step for removing contamination formed after etching for forming a cavity by removing sacrifice layer formed of an insulating film through a through hole in an electroconductive film upon forming a cavity of a micromachine (electrodynamic micromachine) (see, for example, JP-A-2009-122031).

EXAMPLE

The present invention will be described in more detail with reference to examples and comparative examples below, but the present invention is not limited to the examples.
Preparation of Processing Liquid
Processing liquids for suppressing pattern collapse of a fine metal structure were prepared according to the formulation compositions (% by mass) shown in Table 1.

TABLE 1

| | Kind | Number of carbon atoms of alkyl group *1 | Content |
|---|---|---|---|
| Processing liquid 1 | 1-dodecyl-3-methylimidazolium chloride | C12 | 5,000 ppm |
| Processing liquid 2 | 1-tetradecyl-3-methylimidazolium chloride | C14 | 1,000 ppm |
| Processing liquid 3 | 1-hexadecyl-3-methylimidazolium chloride | C16 | 500 ppm |
| Processing liquid 4 | tetradecylpyridinium chloride | C14 | 3,000 ppm |
| Processing liquid 5 | 1-tetradecyl-4-methylpyridinium chloride | C14 | 1,500 ppm |
| Processing liquid 6 | hexadecylpyridinium chloride | C16 | 300 ppm |
| Processing liquid 7 | 1-hexadecyl-4-methylpyridinium chloride | C16 | 100 ppm |
| Processing liquid 8 | tetradecyltrimethylammonium chloride | C14 | 5,000 ppm |
| Processing liquid 9 | benzyldimethyltetradecyl- ammonium chloride | C14 | 2,000 ppm |
| Processing liquid 10 | hexadecyltrimethylammonium chloride | C16 | 200 ppm |
| Processing liquid 11 | benzyldimethylhexadecyl- ammonium chloride | C16 | 500 ppm |
| Processing liquid 12 | octadecyltrimethylammonium chloride | C18 | 100 ppm |
| Processing liquid 13 | benzyldimethyloctadecyl- ammonium chloride | C18 | 10 ppm |
| Processing liquid 14 | dodecyldimethylaminoacetic acid betaine | C12 | 10% |
| Processing liquid 15 | palm oil fatty acid amide propylbetaine | C12, C14, C16 | 100 ppm |
| Processing liquid 16 | dimethyltetradecylamine oxide | C14 | 1% |
| Processing liquid 17 | dimethylhexadecylamine oxide | C16 | 5,000 ppm |
| Processing liquid 18 | dimethyloctadecylamine oxide | C18 | 50 ppm |

*1 Number of carbon atoms of the alkyl group owned by the compounds

Examples 1 to 18

As shown in FIG. 1(a), silicon nitride 103 (thickness: 100 nm) and silicon oxide 102 (thickness: 1,200 nm) were formed as films on a silicon substrate 104, then a photoresist 101 was formed, and the photoresist 101 was exposed and developed, thereby forming a circular and ring-shaped opening 105 (diameter: 125 nm, distance between circles: 50 nm), as shown in FIG. 1(b). The silicon oxide 102 was etched by dry etching with the photoresist 101 as a mask, thereby forming a cylindrical hole 106 reaching the layer of silicon nitride 103, as shown in FIG. 1(c). The photoresist 101 was then removed by ashing, thereby providing a structure having the silicon oxide 102 with the cylindrical hole 106 reaching the layer of silicon nitride 103, as shown in FIG. 1(d). The cylindrical hole 106 of the resulting structure was filled with tungsten as a metal 107 (FIG. 1(e)), and an excessive portion of the metal (tungsten) 107 was removed by chemical mechanical polishing (CMP), thereby providing a structure having the silicon oxide 102 with a cylindrical hollow of the metal (tungsten) 108 embedded therein, as shown in FIG. 1(f). The silicon oxide 102 of the resulting structure was removed by dissolving with a 0.5% hydrofluoric acid aqueous solution (by dipping at 25° C. for 1 minute), and then the structure was processed by making into contact with pure water, the processing liquids 1 to 18 (by dipping at 30° C. for 10 minutes), and pure water in this order, followed by drying, thereby providing a structure shown in FIG. 1(g).

The resulting structure had a fine structure with a chimney pattern containing cylindrical hollows of the metal (tungsten) (diameter: 125 nm, height: 1,200 nm (aspect ratio: 9.6), distance between the cylindrical hollows: 50 nm), and 70% or more of the pattern was not collapsed.

The pattern collapse was observed with "FE-SEM S-5500 (model number)", produced by Hitachi High-Technologies Corporation, and the collapse suppression ratio was a value obtained by calculating the ratio of the collapsed pattern in the total pattern. Cases where the collapse suppression ratio was 50% or more were determined as "passed". The processing liquids, the processing methods and the results of collapse suppression ratios in the examples are shown in Table 3.

Comparative Example 1

A structure shown in FIG. 1(g) was obtained in the same manner as in Example 1 except that after removing the silicon oxide 102 of the structure shown in FIG. 1(f) by dissolving with hydrofluoric acid, the structure was processed only with pure water. 50% or more of the pattern of the resulting structure was collapsed as shown in FIG. 1(h) (which indicated a collapse suppression ratio of less than 50%). The processing liquid, the processing method and the result of collapse suppression ratio in Comparative Example 1 are shown in Table 3.

Comparative Examples 2 to 14

Structures shown in FIG. 1(g) of Comparative Examples 2 to 14 were obtained in the same manner as in Example 1 except that after removing the silicon oxide 102 of the structure shown in FIG. 1(f) by dissolving with hydrofluoric acid, the structures were processed with the comparative liquids 1 to 13 shown in Table 2 instead of the processing liquid 1. 50% or more of the pattern of the resulting structures was collapsed as shown in FIG. 1(h). The comparative liquids, the processing methods and the results of collapse suppression ratios in the comparative examples are shown in Table 3.

TABLE 2

| | Name of substance |
|---|---|
| Comparative liquid 1 | isopropyl alcohol |
| Comparative liquid 2 | diethylene glycol monomethyl ether |
| Comparative liquid 3 | dimethylacetamide |

TABLE 2-continued

| | Name of substance |
|---|---|
| Comparative liquid 4 | ammonium halide perfluoroalkylsulfonate *1 |
| Comparative liquid 5 | perfluoroalkylcarbonate salt *2 |
| Comparative liquid 6 | ethylene oxide adduct of 2,4,7,9-tetramethyl-5-decine-4,7-diol *3 |
| Comparative liquid 7 | 2,4,7,9-tetramethyl-5-decine-4,7-diol *4 |
| Comparative liquid 8 | tridecylmethylammonium chloride (number of carbon atoms of alkyl group: 12) *5 |
| Comparative liquid 9 | polyoxyethylene polyoxypropylene block polymer *6 |
| Comparative liquid 10 | 1-decyl-3-methylimidazolium chloride (number of carbon atoms of alkyl group: 10) |
| Comparative liquid 11 | 1-dodecylpyridinium chloride (number of carbon atoms of alkyl group: 12) |
| Comparative liquid 12 | 1-decyl-3-methylimidazolium chloride (number of carbon atoms of alkyl group: 10) |
| Comparative liquid 13 | dimethyldodecylamine oxide (number of carbon atoms of alkyl group: 12) |

*1 "Fluorad FC-93", a trade name, produced by 3M Corporation, 0.01% aqueous solution
*2 "Surfron S-111", a trade name, produced by AGC Seimi Chemical Co., Ltd., 0.01% aqueous solution
*3 "Surfynol 420", a trade name, produced by Nisshin Chemical Industry Co., Ltd., 0.01% aqueous solution
*4 "Surfynol 104", a trade name, produced by Nisshin Chemical Industry Co., Ltd., 0.01% aqueous solution
*5 "Catiogen TML", a trade name produced by Dai-ichi Kogyo Seiyaku Co., Ltd., 0.01% aqueous solution
*6 "Epan 420", a trade name produced by Dai-ichi Kogyo Seiyaku Co., Ltd., 0.01% aqueous solution

TABLE 3

| | Processing method | Collapse suppression ratio *1 | Pass or fail |
|---|---|---|---|
| Example 1 | pure water –> processing liquid 1 –> pure water –> drying | 70% or more | pass |
| Example 2 | pure water –> processing liquid 2 –> pure water –> drying | 80% or more | pass |
| Example 3 | pure water –> processing liquid 3 –> pure water –> drying | 80% or more | pass |
| Example 4 | pure water –> processing liquid 4 –> pure water –> drying | 70% or more | pass |
| Example 5 | pure water –> processing liquid 5 –> pure water –> drying | 70% or more | pass |
| Example 6 | pure water –> processing liquid 6 –> pure water –> drying | 80% or more | pass |
| Example 7 | pure water –> processing liquid 7 –> pure water –> drying | 70% or more | pass |
| Example 8 | pure water –> processing liquid 8 –> pure water –> drying | 70% or more | pass |
| Example 9 | pure water –> processing liquid 9 –> pure water –> drying | 70% or more | pass |
| Example 10 | pure water –> processing liquid 10 –> pure water –> drying | 80% or more | pass |
| Example 11 | pure water –> processing liquid 11 –> pure water –> drying | 80% or more | pass |
| Example 12 | pure water –> processing liquid 12 –> pure water –> drying | 70% or more | pass |
| Example 13 | pure water –> processing liquid 13 –> pure water –> drying | 80% or more | pass |
| Example 14 | pure water –> processing liquid 14 –> pure water –> drying | 90% or more | pass |
| Example 15 | pure water –> processing liquid 15 –> pure water –> drying | 70% or more | pass |
| Example 16 | pure water –> processing liquid 16 –> pure water –> drying | 70% or more | pass |
| Example 17 | pure water –> processing liquid 17 –> pure water –> drying | 80% or more | pass |
| Example 18 | pure water –> processing liquid 18 –> pure water –> drying | 90% or more | pass |
| Comparative Example 1 | pure water –> drying | less than 50% | fail |
| Comparative Example 2 | pure water –> comparative liquid 1 –> pure water –> drying | less than 50% | fail |
| Comparative Example 3 | pure water –> comparative liquid 2 –> pure water –> drying | less than 50% | fail |
| Comparative Example 4 | pure water –> comparative liquid 3 –> pure water –> drying | less than 50% | fail |
| Comparative Example 5 | pure water –> comparative liquid 4 –> pure water –> drying | less than 50% | fail |
| Comparative Example 6 | pure water –> comparative liquid 5 –> pure water –> drying | less than 50% | fail |
| Comparative Example 7 | pure water –> comparative liquid 6 –> pure water –> drying | less than 50% | fail |
| Comparative Example 8 | pure water –> comparative liquid 7 –> pure water –> drying | less than 50% | fail |
| Comparative Example 9 | pure water –> comparative liquid 8 –> pure water –> drying | less than 50% | fail |
| Comparative Example 10 | pure water –> comparative liquid 9 –> pure water –> drying | less than 50% | fail |
| Comparative Example 11 | pure water –> comparative liquid 10 –> pure water –> drying | less than 50% | fail |
| Comparative Example 12 | pure water –> comparative liquid 11 –> pure water –> drying | less than 50% | fail |
| Comparative Example 13 | pure water –> comparative liquid 12 –> pure water –> drying | less than 50% | fail |
| Comparative Example 14 | pure water –> comparative liquid 13 –> pure water –> drying | less than 50% | fail |

*1 collapse suppression ratio = ((number of cylindrical hollows not collapsed)/(total number of cylindrical hollows)) × 100 (%)

INDUSTRIAL APPLICABILITY

The processing liquid of the present invention may be used favorably for suppressing pattern collapse of a fine metal structure, such as a semiconductor device and a micromachine (MEMS).

DESCRIPTION OF THE SYMBOLS 101 photoresist
102 silicon oxide
103 silicon nitride
104 silicon substrate
105 circular opening
106 cylindrical hole
107 metal (tungsten)
108 cylindrical hollow of metal (tungsten)

The invention claimed is:

1. A method for producing a fine metal structure, comprising:
    wet etching or dry etching,
    rinsing contamination formed after said wet etching or dry etching,
    subsequently rinsing with a processing liquid,
    rinsing with pure water after rinsing with said processing liquid, and
    drying immediately after said rinsing with pure water,
    wherein the processing liquid comprises at least one compound selected from the group consisting of:
    an imidazolium halide comprising an alkyl group containing 12, 14, or 16 carbon atoms;
    a pyridinium halide comprising an alkyl group containing 14 or 16 carbon atoms;
    a betaine comprising an alkyl group containing 12, 14, or 16 carbon atoms; and
    an amine oxide comprising an alkyl group containing 14, 16, or 18 carbon atoms,
    wherein a content of said at least one compound in the processing liquid is from 10 ppm to 10% by mass.

2. The method of claim 1,
wherein a pattern of the fine metal structure comprises tungsten.

3. The method of claim 1, wherein the fine metal structure is a semiconductor device or a micromachine.

4. The method of claim 1, wherein the processing liquid comprises at least one compound selected from the group consisting of:
- an imidazolium halide comprising a dodecyl group, a tetradecyl group, or a hexadecyl group;
- a pyridinium halide comprising a tetradecyl group or a hexadecyl group;
- a betaine comprising a dodecyl group, a tetradecyl group, or a hexadecyl group; and
- an amine oxide comprising a tetradecyl group, a hexadecyl group, or an octadecyl group.

5. The method of claim 1, wherein a content of the at least one compound in the processing liquid is from 10 ppm to 1000 ppm.

6. The method of claim 1, wherein the processing liquid comprises dodecyldimethylaminoacetic acid betaine, palm oil fatty acid amide propylbetaine, or both, as a betaine.

7. The method of claim 1, wherein the processing liquid comprises dimethyltetradecylamine oxide, dimethylhexadecylamine oxide, dimethyloctadecylamine oxide, or a combination thereof, as an amine oxide.

8. The method of claim 1, wherein the processing liquid comprises an imidazolium halide comprising a C14 or C16 alkyl group.

9. The method of claim 1, wherein the processing liquid comprises an imidazolium halide comprising a C16 alkyl group.

10. The method of claim 1, wherein the processing liquid comprises a pyridinium halide comprising a C16 alkyl group.

11. The method of claim 1, wherein the processing liquid comprises an amine oxide comprising a C16 or C18 alkyl group.

12. The method of claim 1, wherein a content of the at least one compound in the processing liquid is from 10 ppm to 5% by mass.

13. The method of claim 1, wherein said processing liquid further comprises water.

14. The method of claim 1, comprising, in the following order:
- wet etching or dry etching to provide etched portions,
- rinsing contamination formed after said wet etching or dry etching,
- filling said etched portions and producing a fine metal structure,
- a first rinsing of said fine metal structure with pure water immediately after said producing said fine metal structure,
- a rinsing of said fine metal structure with said processing liquid immediately after said first rinsing,
- a second rinsing of said fine metal structure with pure water immediately after said rinsing with said processing liquid, and
- drying immediately after said second rinsing with pure water.

* * * * *